United States Patent
Barringer et al.

(10) Patent No.: US 6,660,932 B1
(45) Date of Patent: Dec. 9, 2003

(54) DYNAMICALLY MOVEABLE EXHAUSTING EMC SEALING SYSTEM

(75) Inventors: Dennis R. Barringer, Wallkill, NY (US); Edward J. Seminaro, Milton, NY (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/161,930

(22) Filed: Jun. 5, 2002

(51) Int. Cl.$^7$ ................................................. H05K 9/00
(52) U.S. Cl. ..................... 174/35 R; 361/692; 361/800; 361/816
(58) Field of Search ................... 174/35 R, 35 GC; 361/679, 683, 685, 686, 687, 688, 690, 692, 753, 779, 800, 816, 818

(56) References Cited

U.S. PATENT DOCUMENTS

| | | | |
|---|---|---|---|
| 4,821,145 A | 4/1989 | Corfits et al. | 361/383 |
| 4,821,146 A | 4/1989 | Behrens et al. | 361/383 |
| 4,872,212 A * | 10/1989 | Roos et al. | 361/818 |
| 5,289,347 A * | 2/1994 | McCarthy et al. | 361/809 |
| 5,398,822 A | 3/1995 | McCarthy et al. | 211/41 |
| 5,504,657 A | 4/1996 | Stocco | 361/800 |
| 5,943,219 A | 8/1999 | Bellino et al. | 361/816 |
| 6,449,150 B1 * | 9/2002 | Boone | 361/694 |
| 6,478,170 B1 * | 11/2002 | Zeidan et al. | 211/183 |

FOREIGN PATENT DOCUMENTS

JP  2272796  11/1990

OTHER PUBLICATIONS

"Sheet Metal Logic Cage", IBM Technical Disclosure Bulletin, vol. 37, No. 7, Jul. 1994, pp. 571–572.

* cited by examiner

*Primary Examiner*—Dean A. Reichard
*Assistant Examiner*—Carmelo Oliva
(74) *Attorney, Agent, or Firm*—Floyd A. Gonzales; Cantor Colburn LLP

(57) ABSTRACT

A docking apparatus for printed circuit boards including a cassette housing, having a housing base, a housing cover and a housing wall, wherein the housing base and the housing wall are disposed relative to each other so as to define a housing cavity for containing a printed circuit card and wherein the housing wall includes a cable opening disposed so as to be communicated with the housing cavity, a housing bezel, disposed relative to the cassette housing so as to be associated with the cable opening, the housing bezel includes an outer bezel having a first plurality of openings and an inner bezel having a second plurality of apertures, the inner bezel in electrical communication with the printed circuit card, wherein said housing bezel is removable, and an EMC gasket disposed between the outer and inner bezels of said housing bezel, the EMC gasket configured to provide a removable EMC seal proximate the cable opening while still allowing airflow through the first and second plurality of apertures having the EMC gasket therebetween.

22 Claims, 6 Drawing Sheets

DYNAMICALLY MOVEABLE EXHAUSTING EMC SEALING SYSTEM

This invention was made with Government support under subcontract B338307 under prime contract W-7405-ENG-48 awarded by the Department of Energy. The Government has certain rights in this invention.

FIELD OF THE INVENTION

The present invention is generally directed to pluggable cartridges for inserting printed circuit cards into and for removing them from printed circuit boards. More particularly, the present invention is directed to a removable exhausting EMC sealing system incorporated with the cartridge which provides a level of EMC shielding and thermal protection.

BACKGROUND OF THE INVENTION

The past twenty-five or so years have seen the development of ever smaller electrical circuit components at the chip level. However, to take fullest advantage of achievements in electrical circuit miniaturization, one must package the resultant printed circuit cards containing these chips in an efficient manner. Clearly, the packaging of printed circuit cards in tight spaces is a direct logical extension of increasing chip level circuit densities. It should also be noted that the tight packaging of integrated circuit chips on printed circuit cards and the correspondingly dense packaging of the printed circuit cards is a design goal that is carried out for more than just the convenience of compactness. Compactness provides shorter distances between circuit components which, in turn, serves the very desirable goal of being able to operate the circuits effectively at higher frequencies, thus increasing the speed of numerous different forms of electrical systems, including but not limited to data processing systems.

Moreover, mainly for reasons associated with long-term system operation and reliability, it is likewise very desirable to be able to easily insert and remove these printed circuit cards even when they are disposed in very tight spaces. The insertion and removal operations are also provided as an important part of a "hot-pluggability" function which is very desirable for "on the fly" repairs, replacements, maintenance and upgrades.

With increased circuit density there has also been an additional constraint on packaging design. It should be appreciated that increased circuit density is more susceptible to damage and performance disruptions due to thermal effects. As components and circuits become smaller, their packaging becomes smaller thus allowing manufacturers and designers to more densely populate boards and systems. However, the smaller packaging means that there is less opportunity to dissipate heat generated by the component. As a result, any externally radiated heat from PCB's or components surrounding the smaller packaging is less likely to be dissipated, thus producing thermal damage and/or noise within the circuit and component with increased circuit density, there is also a concomitant increase in power density and heat dissipation. Accordingly, packaging designs should be fully compatible with those aspects of system design associated with cooling functions. Also, to whatever extent possible, packaging designs should be: economical to produce; function smoothly; require little or no maintenance; be producible from inexpensive, readily available materials; and be reliably operable over a large number of insertion and removal operation cycles.

Yet one other concern arises in electrical systems as circuit feature size shrinks, operating frequencies increase and packaging densities grow larger, namely, the generation of electromagnetic interference (EMI). Electronic circuit packaging designs should thus also be compatible with structures and configurations that are employed to prevent the leakage of electromagnetic interference. To whatever extent possible, packaging designs should also include structures which actually contribute positively to the containment of electromagnetic interference. There is an ever increasing problem of electromagnetic interference caused by such devices. Virtually every electronic device, intentionally or not, emits some form of electromagnetic radiation. While this condition could be tolerated when few devices existed, the increasing number of electronic devices has made the problem more acute. The problem has been exacerbated by the "improvement" in semiconductor devices which allows them to operate at higher speeds, generally causing emission in the higher frequency bands where interference is more likely to occur. Successful minimization of the interference problem, sometimes referred to as "electromagnetic compatibility" or "EMC", generally requires that emissions from a given device be reduced by shielding and other means, and shielding be employed to reduce the sensitivity of a device to fields from other devices. Since shielding helps to reduce sensitivity to external fields as well as reduce emissions from the device, it is a common approach to a solution of the problem.

It is also noted that the present discussion refers to printed circuit boards and printed circuit cards. As contemplated herein, the printed circuit board is the larger component into which at least one printed circuit card is inserted for purposes of electrical connection. The present disclosure places no specific limits on either the size of a printed circuit board or the size of a printed circuit card. In the most general situation, a circuit board will be populated with a plurality of printed circuit cards. That is, the printed board will have a number of printed circuit cards inserted therein. Accordingly, as used herein, the terms "printed circuit board" and "printed circuit card" are considered to be relative terms.

Accordingly, the present inventors are presented with the following sometimes competing packaging problems: dense and close packaging, cooling, electromagnetic interference shielding, hot pluggability, the desire to provide an easy-to-load cartridge for carrying printed circuit cards, the removal of fully populated printed circuit boards and the insertion thereof, and means to provide a removable cooperative EMI shielding arrangement in a system which also provides circuit board thermal protection.

SUMMARY OF THE INVENTION

A docking apparatus for printed circuit boards including a cassette housing, having a housing base, a housing cover and a housing wall, wherein the housing base and the housing wall are disposed relative to each other so as to define a housing cavity for containing a printed circuit card and wherein the housing wall includes a cable opening disposed so as to be communicated with the housing cavity, a housing bezel, disposed relative to the cassette housing so as to be associated with the cable opening, the housing bezel includes an outer bezel having a first plurality of openings and an inner bezel having a second plurality of apertures, the inner bezel in electrical communication with the printed circuit card, wherein said housing bezel is removable, and an EMC gasket disposed between the outer and inner bezels of said housing bezel, the EMC gasket configured to provide a removable EMC seal proximate the cable opening while still allowing airflow through the first and second plurality of apertures having the EMC gasket therebetween.

BRIEF DESCRIPTION OF THE DRAWINGS

Referring now to the figures, which are exemplary embodiments, and wherein the like elements are numbered alike.

DETAILED DESCRIPTION OF THE INVENTION

Figure 1:
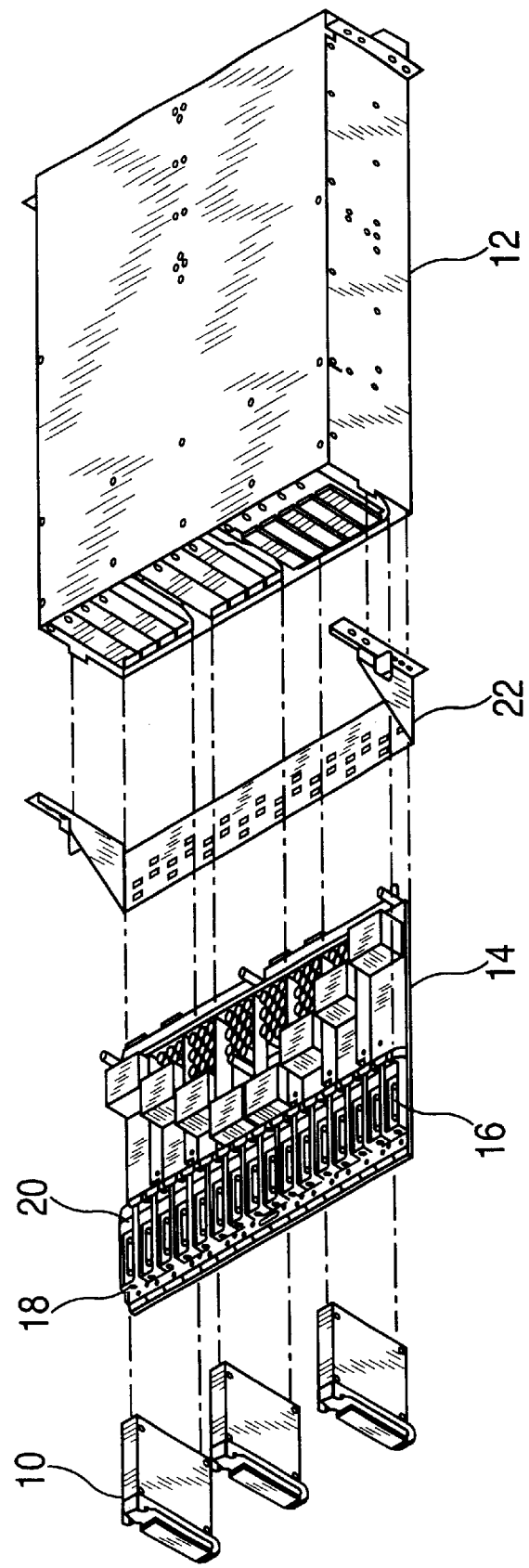
FIG. 1 is an exploded overall view of a docking cassette and a computer system in accordance with an embodiment of the invention.

Referring generally to the FIG. 1, a docking apparatus or cassette 10 for mounting a printed circuit card (PCC) into a computer system 12 is shown, in accordance with an embodiment of the invention. Docking apparatus 10 preferably provides structural support to the PCC so as to allow for the easy insertion and removal of the PCC from computer system 12, as well as thermal and electrical isolation from other PCC's and components within the computer system.

Docking cassette 10 is disposed onto a computer system main board 14 or main printed circuit board (PCB) having a PCB connector receptacle 16, a first receptacle 18 and a second receptacle 20. Docking cassette 10 is preferably disposed onto computer system main board 14 such that a PCB connector is adjacent to PCB connector receptacle 16. In addition, main board 14 is slidably engaged with a cable tray 22 for releasably supporting and securing computer system 12 in a system rack (not shown).

Figure 2:
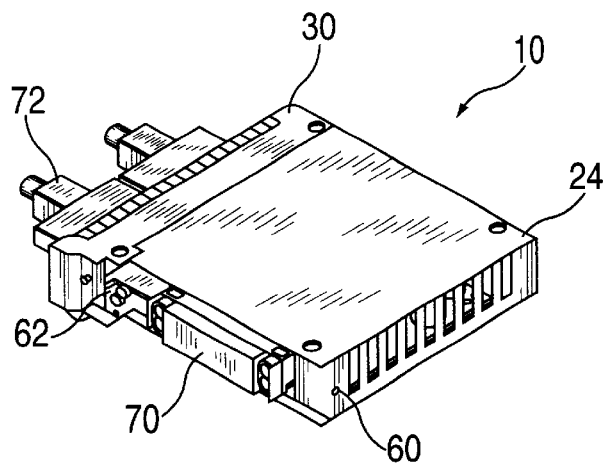
FIG. 2 is a perspective view of a docking cassette in accordance with an embodiment of the invention.
Figure 3:
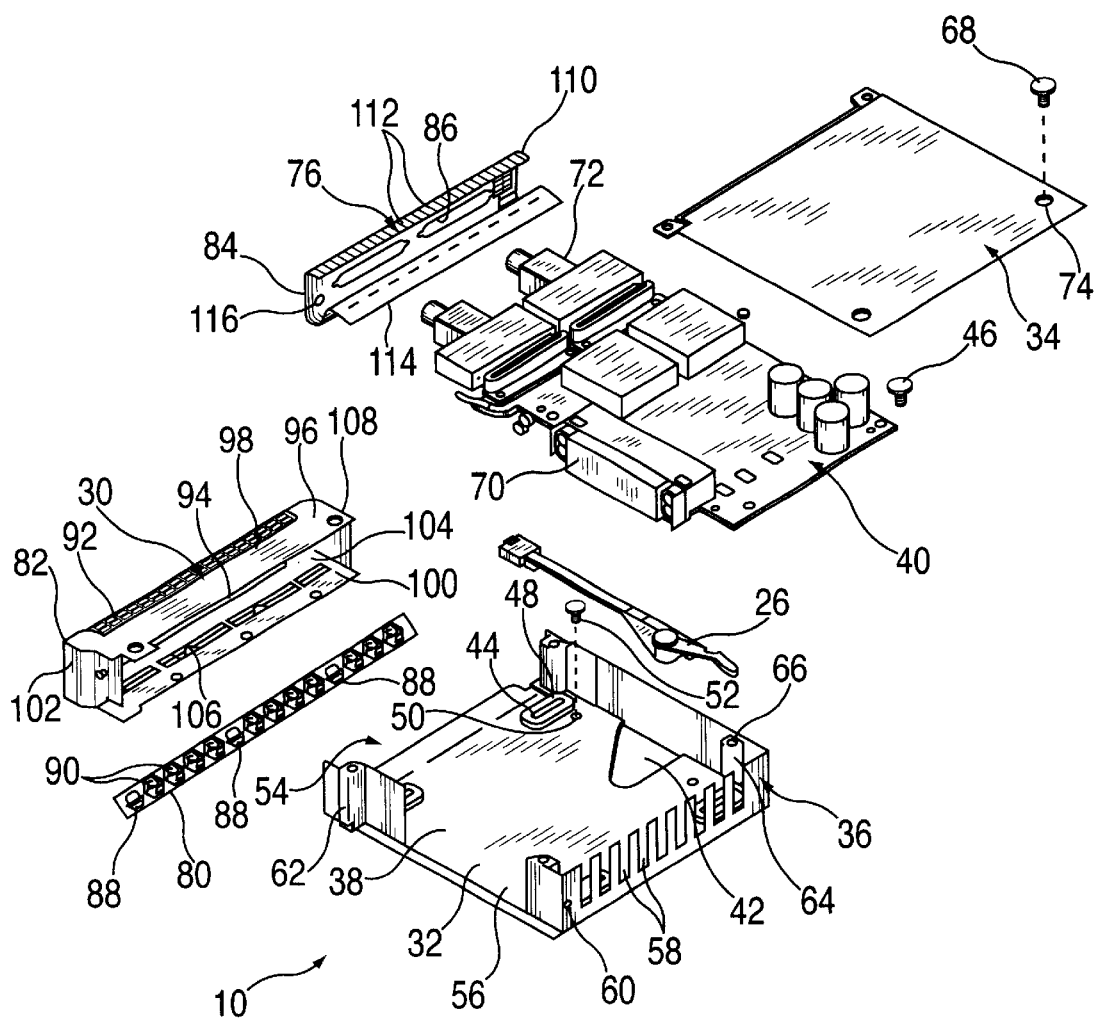
FIG. 3 is an exploded view of a docking cassette in accordance with an embodiment of the invention.

Referring to FIGS. 2 and 3, docking apparatus 10 for mounting to a printed circuit board (PCB) in computer system 12 is shown, in accordance with an embodiment of the invention. Docking apparatus 10 preferably includes a cassette housing 24, a linkage mechanism 26 and a housing bezel 30. Cassette housing 24 preferably includes a housing base 32, a housing cover 34 and a housing wall 36, wherein housing base 32 and housing wall 36 are non-movably associated with each other and disposed relative to each other so as to define a housing cavity 38 for movably containing a PCC 40.

In accordance with an exemplary embodiment, housing base 32 preferably includes a linkage cavity 42 and four mounting devices 44 for movably holding PCC 40. PCC 40 preferably includes a PCC mounting mechanism 46 and mounting device 44 preferably includes a device opening 48 for slidingly containing PCC mounting mechanism 46, wherein PCC mounting mechanism 46 may be a screw, a pin or any mounting mechanism suitable to the desired end purpose. In addition, housing base 32 preferably includes a linkage mounting receptacle 50 for associating linkage mechanism 26 with housing base 32. In accordance with an exemplary embodiment, although linkage mounting receptacle 50 is preferably a receptacle opening for receiving a linkage mounting screw 52, linkage mounting receptacle 50 may be any receptacle device suitable to the desired end purpose, such as a clip receptacle. In accordance with an exemplary embodiment, it is considered within the scope of the disclosure that PCC 40 may be movably associated with housing base 32 using any device or method suitable to the desired end purpose, such as a screw or pin.

Housing wall 36 preferably includes a cable opening 54, a PCB connector opening 56 and a plurality of vent openings 58. In addition, housing wall 36 preferably includes a first protrusion 60 and a second protrusion 62, wherein first protrusion 60 and second protrusion 62 are disposed so as to lockingly engage with main board 14 of computer system 12. In accordance with an embodiment of the invention, first protrusion 60 and second protrusion 62 are shown as being disposed on housing wall 36. However, it is considered within the scope of the invention that first protrusion 60 and second protrusion 62 may be disposed anywhere on cassette housing 24 in a manner suitable to the desired end purpose. Moreover, housing wall 36 preferably includes at least one mounting structure 64 which defines a threaded cavity 66 for receiving a mounting apparatus 68, such as a screw. In addition, PCB connector opening 56 and cable opening 54 are preferably disposed so as to allow communication with the PCB connector 70 and the PCC cable connections 72 when PCC 40 is disposed within housing cavity 38.

Housing cover 34 preferably includes at least one cover opening 74 disposed so as to allow communication with mounting structure 64 when housing cover 34 is associated with housing wall 36. Cover opening 74 is preferably disposed so as to allow mounting apparatus 68 to communicate with threaded cavity 66 for removably securing housing cover 34 with housing wall 36. Although an exemplary embodiment describes housing cover 34 being removably secured with housing wall 36, it is considered within the scope of the disclosure that housing cover 34 may also be removably secured with housing base 32 and/or housing wall 36 using any mounting device or method suitable to the desired end purpose.

Figure 4:
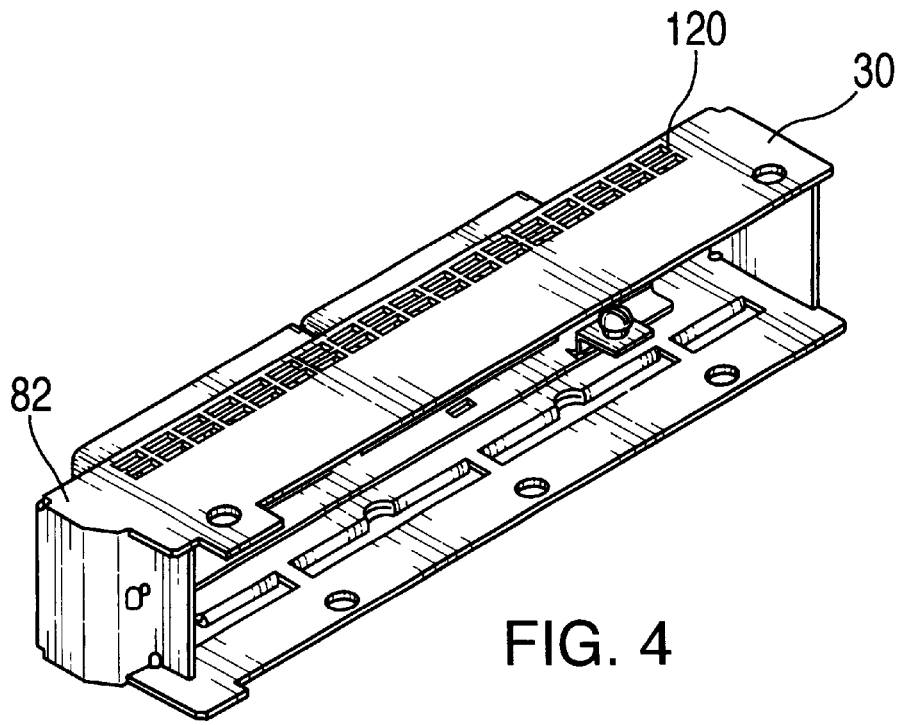
FIG. 4 is a perspective view of an exemplary housing bezel disposed on the docking cassette of FIG. 3.
Figure 5:
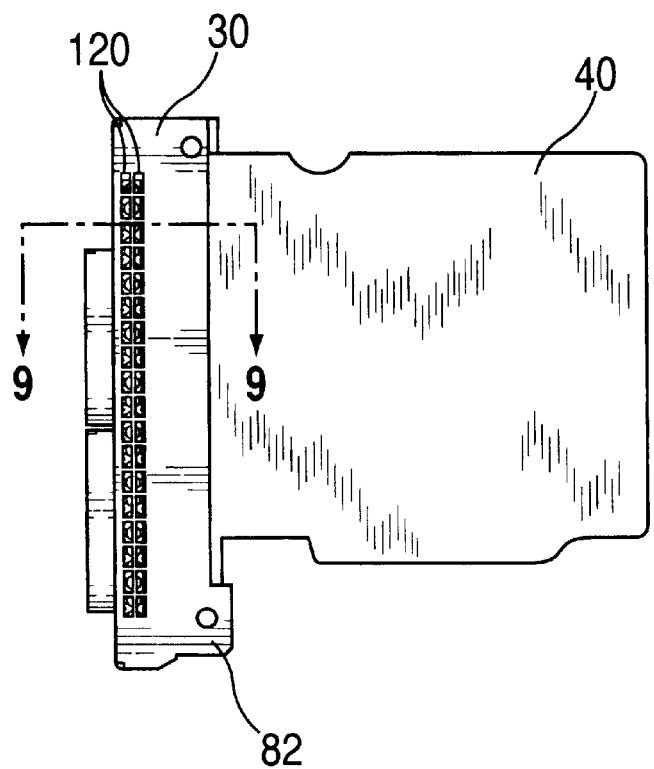
FIG. 5 is a top view of the exemplary housing bezel of FIG. 4 attached to a printed circuit card.
Figure 7:
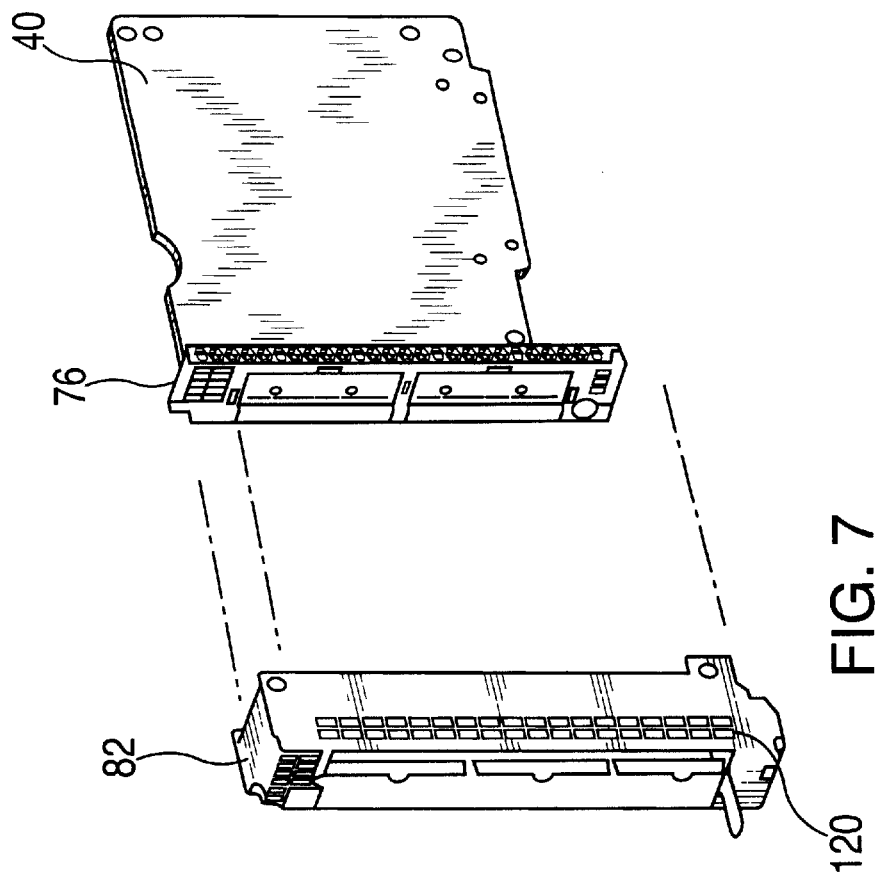
FIG. 7 is an exploded perspective view of the exemplary housing bezel of FIG. 5 attached to the printed circuit card.
Figure 6:
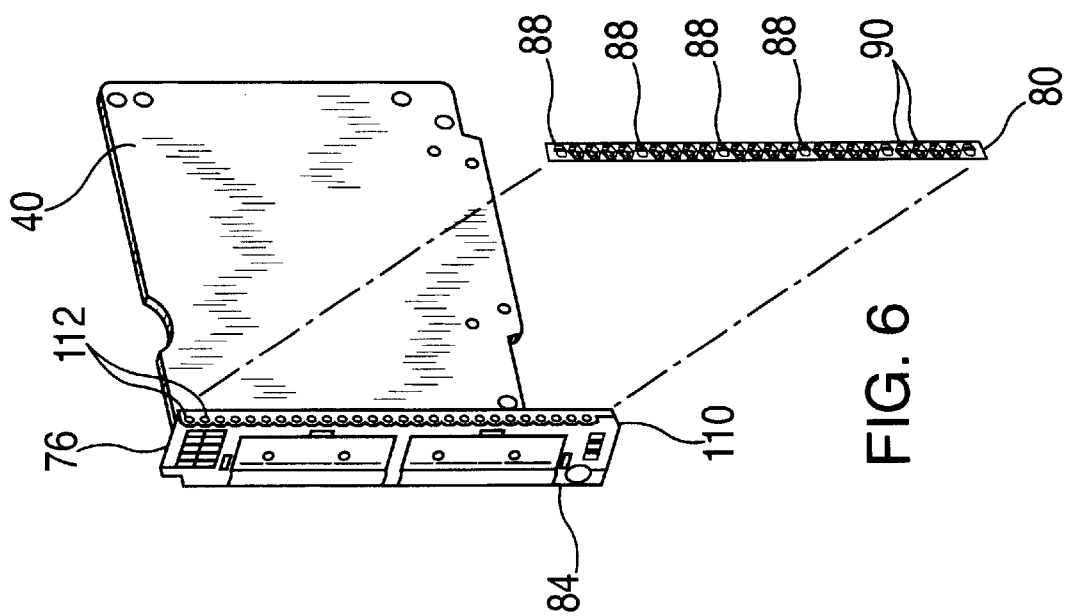
FIG. 6 is a perspective view of the exemplary housing bezel of FIG. 5 attached to the printed circuit card with an outer tail-stock bezel removed.

Referring now to FIGS. 3–5, housing bezel 30 preferably includes an inner tail-stock bezel 76, an EMC gasket 80 and an outer tail-stock bezel 82. Inner bezel 76 preferably includes a forward bezel wall 84 having at least one forward opening 86 (FIG. 3). EMC gasket 80 preferably includes a plurality of apertures 88 disposed along a length defining gasket 80 and plurality of retaining clips 90 extending from an edge of gasket 80 for attachment to a flange extending from inner bezel 76 described more fully below having apertures aligned with apertures 88 of gasket 80 for venting air therethrough. Outer tail-stock bezel 82 preferably includes a tail-stock front 92 having a tail-stock front opening 94 and a tail-stock wall 96 having a tail-stock top 98, a tail-stock bottom 100 and a tail-stock side 102. In accordance with an embodiment of the invention, tail-stock front 92 and tail-stock wall 96 are preferably non-movably associated with each other so as to form a tail-stock cavity 104. In addition, tail-stock bottom 100 preferably includes at least one flanged opening 106. Tail-stock top 98 also preferably includes at least one tail-stock mounting hole 108 for mounting housing bezel 30 to cassette housing 24.

Still referring now to FIGS. 3 and 5, inner tail-stock bezel 76 includes a flange 110 extending from forward bezel wall 84. Flange 110 includes apertures 112 disposed in a length thereof for allowing air to pass therethrough. Retaining clips 88 extending from an edge defining a surface of EMC gasket 80 are configured to clip onto flange 110 such that apertures 90 of gasket 80 are aligned with apertures 112 disposed along flange 110. Inner bezel 76 further includes a mounting lip 114 extending from an opposite edge of wall 84 in the same direction and substantially parallel to flange 110. Mounting lip 114 is configured to mount PCC 40 in an offset position within docking apparatus 10 so that a bottom surface of PCC 40 is not positioned against housing base 32 (shown in FIG. 9).

Referring now to FIGS. 3, 4, 8, and 9, inner bezel 76 having EMC gasket 80 coupled thereto is disposed within tail-stock cavity 104 such that apertures 90 of gasket 80 and apertures 112 of inner bezel are aligned with vents 120 configured in tail-stock wall 96 of outer tail sock bezel 82. In a preferred embodiment, apertures 90 and 112 align with two rows of vents 120 for allowing air to flow therethrough. The two rows of vents 120 is best seen in FIG. 4.

When PCC 40 is operably connected to mounting lip 114 and inner bezel 76 is disposed within tail-stock cavity 104, inner bezel 76 is adjacent to tail-stock front 92 such that the tail-stock front opening 94 and forward opening 86 are also adjacent. Inner bezel 76 is disposed such that tail-stock top 98 electrically engages a top surface of flange 110 via gasket 80. Housing bezel 30 is preferably disposed over cable opening 54 so as to enclose housing cavity 38. In addition, housing bezel 30 is preferably disposed such that tail-stock mounting hole 108 is in communication with cover opening 74 and threaded cavity 66. Housing cover 34, linkage mechanism 26 and tail-stock mechanism 82 are then securely associated with housing wall 36 using mounting apparatus 68.

Figure 9:
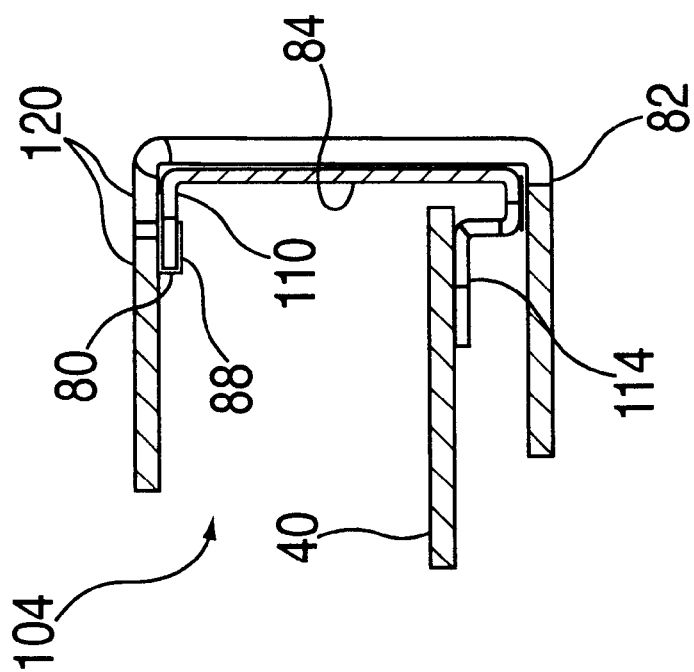
FIG. 9 is a partial cross section view of the exemplary housing bezel of FIGS. 5 and 8 taken along lines 9—9.
Figure 8:
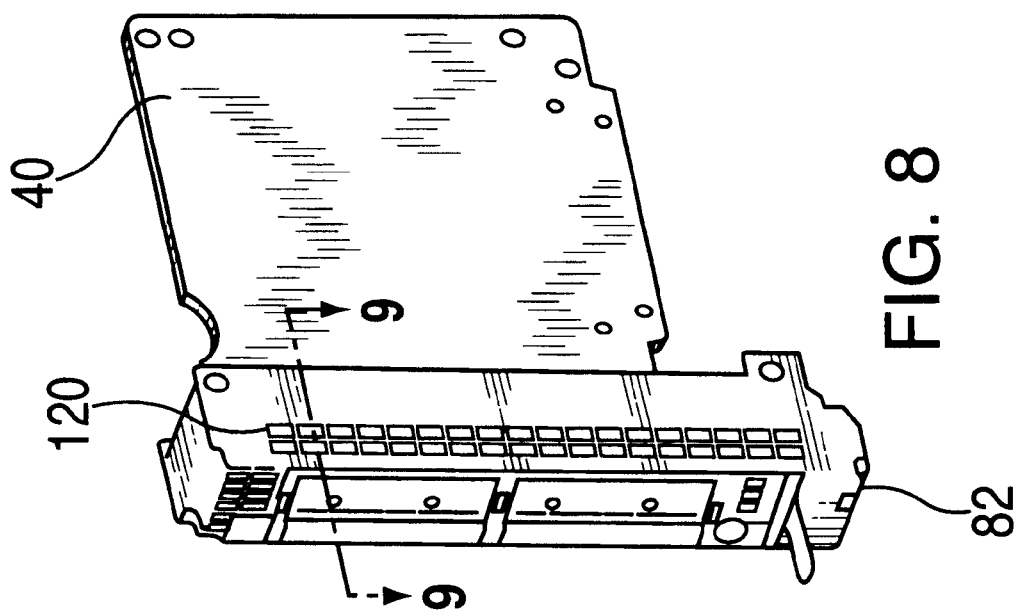
FIG. 8 is a perspective view of a perspective view of the exemplary housing bezel of FIG. 5 attached to the printed circuit card.
Figure 10:
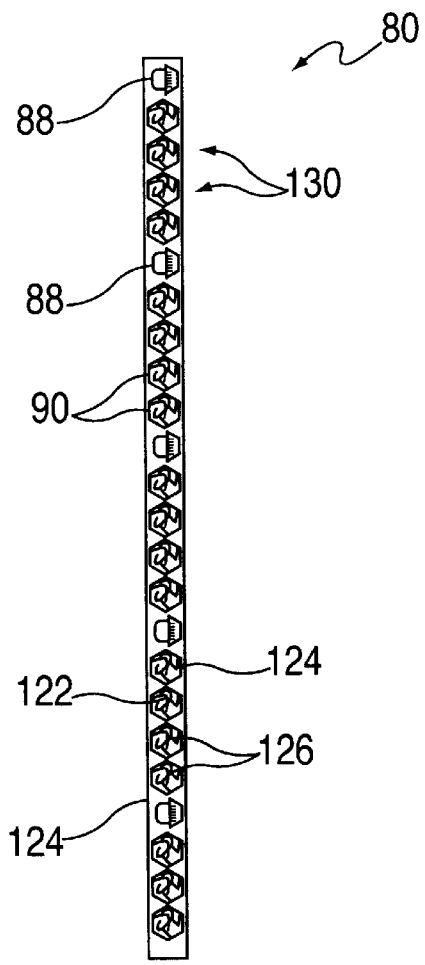
FIG. 10 is a top view of an exemplary EMC sealing gasket used with the exemplary housing bezel in the FIGURES.
Figure 11:
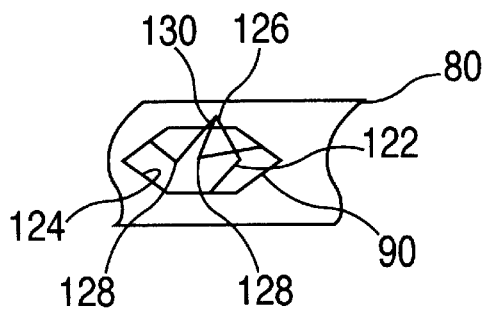
FIG. 11 is a partial perspective view of the exemplary EMC sealing gasket used with the exemplary housing bezel in the FIGURES.

Referring to FIGS. 9–11, gasket 90 is configured to provide electrical continuity between PCC 40, inner tail-stock bezel 76 and outer tail-stock bezel 82 and thus provide EMC shielding while allowing air to flow through vents 120, apertures 90 and 120 aligned with each other. In an exemplary embodiment, gasket 80 includes apertures 90 extending a length of gasket 80. Each aperture 90 is configured defining a hexagon. Three spokes 122 extend radially inwardly and upwardly from three side edges 124 of the six sided edges 124 defining each hexagon shaped aperture 90 terminating in a center 126 to define a compressible pyramid shaped structure 130. Each spoke 122 is configured having at least one bend 128 in a length thereof intermediate said edge 124 and said center 126 to increase compressibility of the pyramid structure 130 formed by the three spokes 122. The pyramid structure 130 is outlined with three spokes 122 terminating to a point at center 126 which is substantially a center of the hexagon defined by aperture 90 while still allowing air to flow through aperture 90. Pyramid structure 130 is compressible to provide electrical continuity between inner bezel 76 and outer bezel 82 when gasket 80 is disposed therebetween providing air flow and EMC sealing, while allowing universal fit and adaptability. Compressible pyramid 130 allows universal fit and adaptability because it is clipped onto inner bezel 76 via clips 88 and allows installation with different dimensioned outer bezels 82 while maintaining EMC sealing as a result of the compressible spokes 122 extending from a surface of gasket 80 to provide contact with outer bezel 82. It will be understood that although EMC gasket 80 has been described with apertures 90 defining a hexagon, a number of different configurations may optionally be employed to provide suitable airflow therethrough. In addition, although raised spokes 122 have been described as forming a pyramid structure, more and less than three spokes 122 may be employed to form other configurations, such as, including for example, but not limited to, a hemisphere, a box frame structure, and the like.

Figure 12:
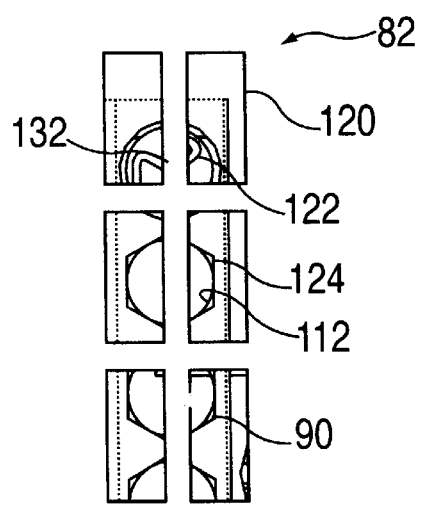
FIG. 12 is a partial enlarged top perspective view of the exemplary housing bezel of FIG. 4 illustrating cooperation between vents in the outer tail-stock bezel and the exemplary EMC sealing gasket.

Referring to FIG. 12, an enlarged view of FIG. 5 is shown detailing cooperation between EMC gasket 80 providing electrical continuity between inner bezel 76 via clips 88 and outer bezel 82 via an intermediate rib 132 separating one row of vents 120 from another row of vents 120. More specifically a bottom surface of EMC gasket 80 and clips 88 contact inner bezel 76 while center 126 contacts a bottom surface defining rib 132 of outer bezel 82 while allowing air to flow through corresponding apertures aligned with each other as shown in FIG. 12. Again, it will be appreciated that although spokes 122 meet at center 126 corresponding to generally to a center thereof or within aperture 90 and 110, it is contemplated that spokes 122 may form other compressible configurations that also do not necessarily form an apex of the resulting structure disposed above apertures 90 and 110.

In accordance with an embodiment of the invention and referring to FIGS. 10 and 11, EMC gasket 80 is preferably constructed from a rigid material having sufficient strength and electromagnetic compatibility properties, such as beryllium copper and/or stainless steel. However, it is considered within the scope of the invention that gasket 80 may be constructed from any material suitable to the desired end purpose. It will also be understood that although EMC gasket has been described having a pyramid structure disposed over aperture 90 to provide electrical continuity between inner and outer bezels 76 and 82, a different configuration and /or number of spokes 122 are contemplated and do not necessarily extend over aperture 90 or terminate above aperture 90 as described above for one exemplary embodiment. The EMC gasket described herein is a movable seal that allows for PCC insertion and extraction with the docking cassette that is universally adaptable for use with differently configured housing bezels, while still making suitable ground contact and allowing proper air flow therethrough.

In accordance with an embodiment of the invention, inner tail-stock bezel 76 and outer tail-stock bezel 82 are preferably constructed from a rigid material having sufficient strength, such as steel and/or stainless steel. However, it is considered within the scope of the invention that inner tail-stock bezel 76 and outer tail-stock bezel 82 may be constructed from any material suitable to the desired end purpose.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A docking apparatus for printed circuit boards comprising:
   a cassette housing, having a housing base, a housing cover and a housing wall, wherein said housing base and said housing wall are disposed relative to each other so as to define a housing cavity for containing a printed circuit card and wherein said housing wall includes a cable opening disposed so as to be communicated with said housing cavity;
   a housing bezel, disposed relative to said cassette housing so as to be associated with said cable opening, said housing bezel includes an outer bezel having a first plurality of openings and an inner bezel having a second plurality of apertures, said inner bezel in electrical communication with said printed circuit card, wherein said housing bezel is removable; and
   an EMC gasket disposed between said outer and inner bezels of said housing bezel, said EMC gasket configured to provide a removable EMC seal proximate said cable opening while still allowing airflow through said first and second plurality of apertures having said EMC gasket therebetween.

2. The docking apparatus according to claim 1, wherein said first and second plurality of openings provide airflow to cool said printed circuit board.

3. The docking apparatus according to claim 1, wherein said outer bezel provides said EMC seal having electrical engagement with said inner bezel that is in electrical contact with said printed circuit card, said printed circuit card is in electrical contact with said housing base, and said housing base is referenced to ground.

4. The docking apparatus according to claim 3, wherein said housing base, said outer bezel and said inner bezel are made from a metallic material.

5. The docking apparatus according to claim 1, wherein said outer bezel includes a first flange having said first plurality of openings configured therein to form two rows of vent holes along a portion of a length of said first flange, said inner bezel includes a second flange configured having said second plurality of openings aligned with said two rows of vents holes, said EMC gasket configured with corresponding apertures substantially aligned with said vent holes and said second plurality of openings to allow air flow therethrough while removably secured in a gap formed between said first and second flanges of said housing bezel to form said EMC seal.

6. The docking apparatus according to claim 5, wherein said EMC gasket is configured to removably attach to said second flange of said inner bezel and align said second plurality of openings in said inner bezel with said corresponding apertures in said gasket, said gasket configured to provide compressible contact with said first flange of said outer bezel to provide said EMC seal while still allowing airflow through said first and second plurality of openings having said gasket disposed therebetween.

7. The docking apparatus according to claim 1, wherein said EMC gasket is configured to form said EMC seal at a gap formed between said inner and outer bezels while still allowing airflow through said gap.

8. The docking apparatus according to claim 7, wherein said EMC gasket comprises:
   a thin metal strip having a corresponding plurality of apertures along a surface defining a length thereof aligned with said second plurality of holes of said inner bezel;
   a plurality of clips extending from at least one edge defining said surface, said clips configured to removably secure said gasket to said inner bezel; and
   a plurality of compressible contacts extending toward said outer bezel from said surface to make electrical contact with said outer bezel to form said EMC seal while allowing airflow in and out of said housing cavity.

9. The docking apparatus according to claim 8, wherein at least one of said plurality of contacts is configured having a plurality of spokes forming a compressible structure, each spoke extending radially inwardly from an edge defining each of said corresponding plurality of apertures to join with said each spoke.

10. The docking apparatus according to claim 9, wherein said each spoke includes at least bend along a length thereof to facilitate compression of said compressible structure.

11. The docking apparatus according to claim 1, wherein said first and second plurality of openings are in coaction with a plurality of vents formed on a portion of said housing wall opposite said cable opening.

12. The docking apparatus according to claim 1, wherein contact between said outer and inner bezels via EMC gasket is via metal contact.

13. The docking apparatus according to claim 1, wherein said inner bezel includes a lip configured to electrically connect with said printed circuit card that is connected to said housing base referenced to ground.

14. The docking apparatus according to claim 1, wherein said housing bezel and said cassette housing are removably secured with each other using one of a screw, a clip and a press-fit assembly.

15. The docking apparatus according to claim 1, wherein said housing bezel and said cassette housing are removably secured with each other using a clip.

16. A docking apparatus comprising:
   a printed circuit card;
   a cassette housing having a mounting device and defining a housing cavity for movably containing said printed circuit card, said mounting device is disposed within said housing cavity so as to slidingly contain said printed circuit card within said housing cavity; and
   a housing bezel having a plurality of openings and a removable EMC gasket configured to removably seal against EMC and allow airflow to said printed circuit card disposed within said housing cavity so as to be in communication with said printed circuit card while providing an EMC seal when said outer bezel is removably engaged with said cassette housing.

17. The docking apparatus according to claim 16, wherein said EMC gasket is a metallic material configured to allow said card extraction and insertion while still making a suitable ground contact.

18. The docking apparatus according to claim 17, wherein said EMC gasket is configured for use in differently configured housing bezels.

19. The docking apparatus according to claim 18, wherein said housing bezel comprises:
   an outer bezel having a first plurality of openings; and
   an inner bezel having a second plurality of openings substantially aligned with said first plurality of openings, said inner bezel is configured to be received in said outer bezel having said EMC gasket therebetween providing said EMC seal and allowing airflow to said printed circuit board.

20. The docking apparatus according to claim 16, further comprising:

a plurality of vents formed on a one side of said wall coacting with said plurality of openings in the top of said housing bezel to aid air flowing through said housing.

21. An apparatus for providing a thermal protection and electromagnetic conduction seal in a docking apparatus having a printed circuit card disposed therein for connection to a system backplane, said apparatus comprising:

a conductive cassette housing, having a housing base, a housing cover and a housing wall, wherein said housing base and said housing wall are disposed relative to each other so as to define a housing cavity for containing a printed circuit card and wherein said housing wall includes a cable opening disposed so as to be communicated with said housing cavity and a connector opening for a connector exposed in said connector opening for mating and connection with the system backplane;

a housing bezel, wherein said housing bezel is disposed relative to said cassette housing so as to be associated with said cable opening, wherein said housing bezel is removable, said housing bezel including a plurality of openings in the top of said housing bezel for the flow of cooling air;

an EMC gasket providing an EMC seal between said top of said cassette housing and a bottom surface of said top of said housing bezel, said EMC gasket configured to provide thermal protection and electromagnetic conduction seal to said printed circuit card; and a plurality of vents formed on one side of said wall coacting with said plurality of openings in said plurality of openings in the top of said housing bezel to aid air flowing through said housing and providing electromagnetic shielding for said circuit card positioned within.

22. The apparatus according to claim 21, wherein said plurality of vents are formed on a side distal from said plurality of vents formed in said housing bezel.

* * * * *

UNITED STATES PATENT AND TRADEMARK OFFICE
CERTIFICATE OF CORRECTION

PATENT NO. : 6,660,932 B1
DATED : December 9, 2003
INVENTOR(S) : Barringer et al.

It is certified that error appears in the above-identified patent and that said Letters Patent is hereby corrected as shown below:

Title page,
Item [74], *Attorney, Agent or Firm*, delete "Gonzales" and insert therefor -- Gonzalez --

Column 3,
Line 18, after "3;" delete "and"
Line 27, delete second instance of "a perspective view of"

Column 4,
Line 64, after "apertures" delete "88" and insert therefor -- 90 --
Line 65, after "clips" delete "90" and insert therefor -- 88 --

Column 5,
Line 1, after "apertures" delete "88" and insert therefor -- 90 --
Line 31, after "outer" delete "tail sock" and insert therefor -- tail-stock --
Line 46, after "tail-stock" delete "mechanism" and insert therefor -- bezel --
Line 49, after "gasket" delete "90" and insert -- 80 --

Column 6,
Lines 30 and 34, after "and" delet "110" and insert therefor -- 112 --

Signed and Sealed this

Fifth Day of April, 2005

JON W. DUDAS
*Director of the United States Patent and Trademark Office*